United States Patent
Song et al.

(10) Patent No.: US 9,938,784 B2
(45) Date of Patent: Apr. 10, 2018

(54) REAL-TIME FREQUENCY LOOP SHAPING FOR DRILLING MUD VISCOSITY AND DENSITY MEASUREMENTS

(71) Applicant: Halliburton Energy Services, Inc., Houston, TX (US)

(72) Inventors: Xingyong Song, Houston, TX (US); Jason D. Dykstra, Spring, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/324,104

(22) PCT Filed: Jul. 13, 2016

(86) PCT No.: PCT/US2016/041993
§ 371 (c)(1),
(2) Date: Jan. 5, 2017

(87) PCT Pub. No.: WO2017/011499
PCT Pub. Date: Jan. 19, 2017

(65) Prior Publication Data
US 2017/0204688 A1    Jul. 20, 2017

Related U.S. Application Data

(60) Provisional application No. 62/191,833, filed on Jul. 13, 2015.

(51) Int. Cl.
*E21B 21/06* (2006.01)
*E21B 41/00* (2006.01)
(Continued)

(52) U.S. Cl.
CPC .......... *E21B 21/06* (2013.01); *E21B 41/0092* (2013.01); *G05B 19/048* (2013.01); *G06F 17/5009* (2013.01); *G05B 2219/45129* (2013.01)

(58) Field of Classification Search
None
See application file for complete search history.

(56) References Cited

U.S. PATENT DOCUMENTS 3,301,323 A    1/1967   Parsons
5,624,409 A *  4/1997   Seale ................ A61M 5/16809
                                                         604/246
(Continued)

FOREIGN PATENT DOCUMENTS

WO    2010085401 A1    7/2010

OTHER PUBLICATIONS

ISR/WO for PCT/US2016/041993 dated Oct. 14, 2016.
(Continued)

*Primary Examiner* — Jason Lin
(74) *Attorney, Agent, or Firm* — McDermott Will & Emery LLP

(57) ABSTRACT

Methods control systems for viscosity and density control may include a frequency loop shaping filter for shaping the frequency response in real-time for a multiple inputs multiple outputs (MIMO) system. For example, a method may include drilling a wellbore while circulating a drilling mud through a viscosity and density control system that includes one of: a mechanical separation system, a dilution system, a chemical additive regulation system, and any combination thereof; applying a frequency loop shaping filter to a desired mud viscosity and a desired mud density to produce control signals: a first control signal for the mechanical separation system, a second control signal for the dilution system, a third control signal for the chemical additive regulation system, and any combination thereof; and applying the control signals to the corresponding systems to alter the drilling mud to have a controlled viscosity value and a controlled density value.

20 Claims, 8 Drawing Sheets

(51) Int. Cl.
    *G06F 17/50*     (2006.01)
    *G05B 19/048*    (2006.01)

(56)                References Cited

U.S. PATENT DOCUMENTS

2007/0087927 A1      4/2007  Scott et al.
2008/0128134 A1*     6/2008  Mudunuri ................ C10G 1/02
                                                          166/302
2008/0312891 A1*    12/2008  Maruyama ........... G05B 13/042
                                                            703/7
2009/0260824 A1*    10/2009  Burns .................... C10G 21/22
                                                          166/302
2012/0024602 A1      2/2012  Larson
2012/0118638 A1      5/2012  Orbell et al.
2014/0202772 A1      7/2014  Kulkarni et al.
2014/0231141 A1      8/2014  Hay et al.
2015/0039275 A1      2/2015  Mikhailov et al.
2015/0241863 A1*     8/2015  Lewin .................... H04R 1/005
                                                          700/275

OTHER PUBLICATIONS

"Chapter 11: Loop Shaping,"http://www.cds.caltech.edu/~murray/books/AM05/pdf/am06-loopsyn_16Sep06.pdf, Sep. 16, 2006, 24 pgs.

* cited by examiner

REAL-TIME FREQUENCY LOOP SHAPING FOR DRILLING MUD VISCOSITY AND DENSITY MEASUREMENTS

BACKGROUND

The accurate and reliable knowledge and control of drilling mud properties, especially the density and viscosity, at the drill bit is valuable to drilling processes. The process involves removing drill cuttings from the drilling mud using mechanical separation techniques and components, for example, shakers to remove larger particles, hydrocyclone mud cleaners to remove particles with median size, and centrifuges to remove finer particles.

BRIEF DESCRIPTION OF THE DRAWINGS

The following figures are included to illustrate certain aspects of the embodiments, and should not be viewed as exclusive embodiments. The subject matter disclosed is amenable to considerable modifications, alterations, combinations, and equivalents in form and function, as will occur to those skilled in the art and having the benefit of this disclosure.

Figure 1:
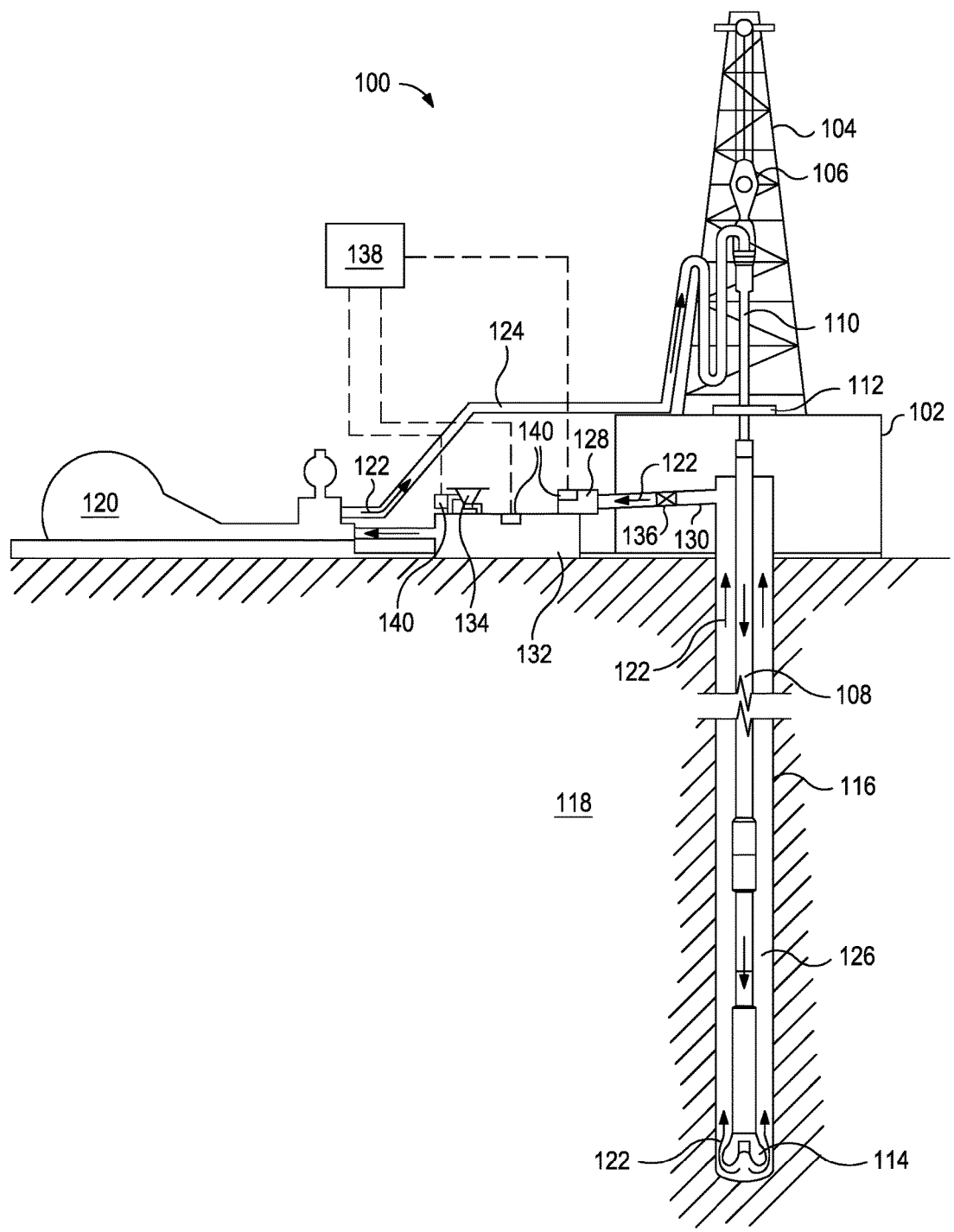
FIG. 1 illustrates an exemplary mud circulation system suitable for implementing the methods described herein.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are methods and systems for enhancing workflow performance in the oil and gas industry. More specifically, the present disclosure uses methods and control systems for viscosity and density control in a fast and reliable fashion by shaping the frequency response in real-time for a multiple inputs multiple outputs (MIMO) system. Instead of only relying on a time domain optimization, embodiments described herein shape the frequency loop for the entire MIMO system on-line to achieve desirable response, tracking accuracy, and robustness against uncertainty/disturbance, which may allow for robust and optimal drilling mud property control with low computational cost in real-time.

FIG. 1 illustrates an exemplary mud circulation system 100 (e.g., a drilling system) suitable for implementing the methods described herein. While FIG. 1 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 100 may include a drilling platform 102 that supports a derrick 104 having a traveling block 106 for raising and lowering a drill string 108. The drill string 108 may include, but is not limited to, drill pipe and coiled tubing as generally known to those skilled in the art. A kelly 110 supports the drill string 108 as it is lowered through a rotary table 112. A drill bit 114 is attached to the distal end of the drill string 108 and is driven either by a downhole motor and/or via rotation of the drill string 108 from the well surface. As the bit 114 rotates, it creates a borehole 116 that penetrates various subterranean formations 118.

A pump 120 (e.g., a mud pump) circulates mud 122 through a feed pipe 124 and to the kelly 110, which conveys the mud 122 downhole through the interior of the drill string 108 and through one or more orifices in the drill bit 114. The mud 122 is then circulated back to the surface via an annulus 126 defined between the drill string 108 and the walls of the borehole 116. At the surface, the recirculated or spent mud 122 exits the annulus 126 and may be conveyed through chokes 136 (also referred to as a choke manifold) to one or more mud cleaning unit(s) 128 (e.g., a shaker, a centrifuge, a hydrocyclone, a separator (including magnetic and electrical separators), a desilter, a desander, a separator, a filter, a heat exchanger, any fluid reclamation equipment, and the like) via an interconnecting flow line 130. After passing through the mud cleaning unit(s) 128, a "cleaned" mud 122 is deposited into a nearby retention pit 132 (e.g., a mud pit or mud tank). While illustrated at the outlet of the wellbore 116 via the annulus 126, those skilled in the art will readily appreciate that the mud cleaning unit(s) 128 may be arranged at any other location in the drilling assembly 100 to facilitate its proper function without departing from the scope of the disclosure.

At the retention pit 132 (or before or after), the mud circulation system may include one or more mud treatment units. The mud 122 may be treated to change its composition and properties. For example, weighting agents like barite may be added to the mud 122 to increase its density. In another example, base fluid may be added to the mud 122 to decrease its density. In the illustrated mud circulation system 100, the addition of materials to the mud 122 may be achieved with a mixer 134 communicably coupled to or otherwise in fluid communication with the retention pit 132. The mixer 134 may include, but is not limited to, mixers, hoppers, flow paths, and related mixing equipment known to those skilled in the art. In other embodiments, however, the materials may be added to the mud 122 at any location in the drilling assembly 100. In at least one embodiment, for example, there could be more than one retention pit 132, such as multiple retention pits 132 in series. Moreover, the retention pit 132 may be representative of one or more fluid storage facilities and/or units where the materials may be stored, reconditioned, and/or regulated until added to the mud 122.

The various components of the mud circulation system 100 may further include one or more sensors, gauges, pumps, compressors, and the like used to store, monitor, regulate, convey, and/or recondition the exemplary muds 122 (e.g., sensors and gauges to measure the composition and/or pressure of the mud, compressors to change the pressure of the mud, and the like).

While not specifically illustrated herein, the disclosed mud circulation system 100 may include drill collars, mud motors, downhole motors and/or pumps associated with the drill string 108, MWD/LWD tools and related telemetry equipment, sensors and/or distributed sensors associated with the drill string 108, downhole heat exchangers, valves and corresponding actuation devices, tool seals, packers and/or other wellbore isolation devices or components, and the like. Further, the mud circulation system 100 and components thereof may include sensors 140 (e.g., at the mud cleaning unit(s) 128, the retention pit 132, or the mixer 134) communicably coupled to control system(s) 138 capable of executing the mathematical algorithms, methods, and/or component/sensor control described herein.

The accuracy and reliability of the knowledge and control of the mud properties, especially the density and viscosity, at the drill bit impacts the entire drilling process. The present disclosure provides methods and control systems for viscosity and density control in a fast and reliable fashion by shaping the frequency response in real-time for a multiple inputs multiple outputs (MIMO) system. Instead of relying only on a time domain optimization, some embodiments described herein shape the frequency loop for the entire MIMO system on-line to achieve desirable response, tracking accuracy, and robustness against uncertainty/disturbance, which may enable robust and optimal drilling mud property control with low computational cost in real-time.

Figure 2:
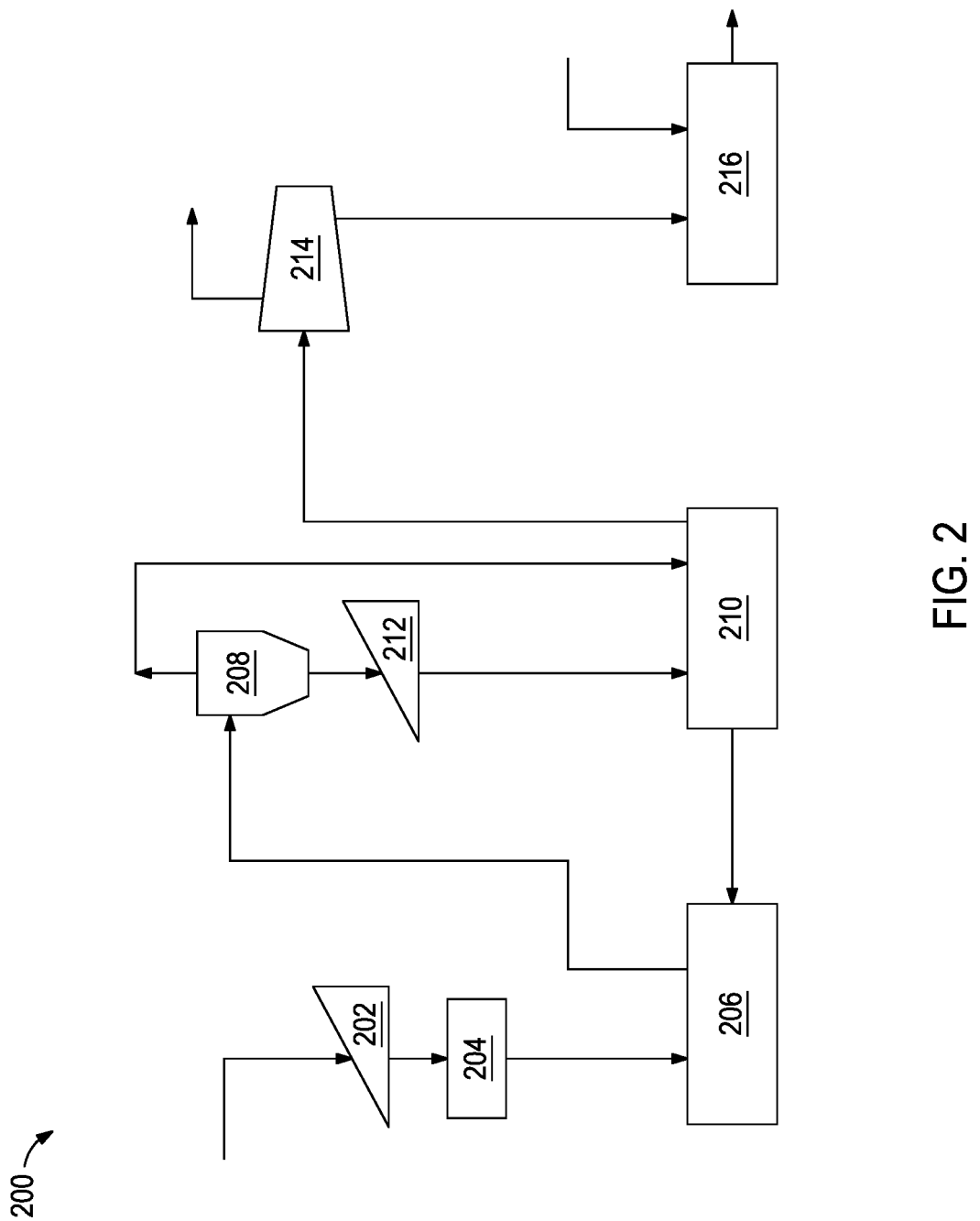
FIG. 2 is a diagram of an exemplary viscosity and density control system described herein.

FIG. 2 is a diagram of an exemplary viscosity and density control system 200 described herein. In this example, the drilling mud is first conveyed to a shaker 202 where drill cuttings are removed and discarded. The drilling mud is then degassed in degasser 204 and diluted in tank 206 or other vessel or container. The diluted drilling mud is then conveyed to a mud cleaner 208 where the supernatant is extracted and diluted in another tank 210 (or optionally tank 206). The portion of the drilling mud with solids is conveyed from mud cleaner 208 to another shaker 212 to remove drill cuttings before also being recombined with the supernatant and diluted in tank 210. The drilling mud is recirculated through the mud cleaner 208, shaker, 212, and dilution tank 210 until a sufficient amount of drill cuttings are removed. Then, the drilling mud is conveyed to a centrifuge 214 to remove and discard low density solids and retain weighting agent like barite. Then, in a pit 216 or tank or other suitable vessel the clean drilling mud is mixed with other additives before being conveyed to the pump for downhole use.

The viscosity and density may be regulated using different components of the mud circulation system together. The process may include removing drill cuttings from the drilling mud using mechanical separation techniques and components, for example, shakers to remove larger particles, hydrocyclone mud cleaners to remove particles with median size, and centrifuges to remove finer particles. The process may also include dilution, typically with water, and adding chemical additives as shown in FIG. 2. Each of the methods has pros and cons in terms of efficiency, cost, viscosity and density control accuracy/uncertainty, frequency response/response time needed for viscosity regulation, and/or robustness against disturbance (such as vibration). For example, water dilution may be faster for viscosity reduction comparing with adding thinners directly, while adding too much water may increase mud weight. In another example, adding thinner appropriately may decrease viscosity, while adding too much thinner may increase the viscosity, which brings in control uncertainty. Additionally, relying too heavily on a mechanical separation system may remove more of a weighting agent like barite, which is expensive and could be recycled into new mud. Given these and other factors, a more appropriate control may allocate control efforts to each system in a proper way, not only for control magnitude but also for the control signal frequency spectrum.

Given the fact that each individual component of the mud circulation system has very different response time (e.g., water flowing rate, mechanical system response time, etc.), only optimizing system performance based on a time-domain cost function may fail to identify effective response regulation and disturbance rejection. Therefore, formulating a way to achieve frequency response shaping in real-time for the overall multiple inputs multiple outputs (MIMO) system may enhance the reliability, speed, and accuracy of performance regulation. Additionally, the formulation may enable efficient convex optimization in real-time as described further herein.

Figure 3:
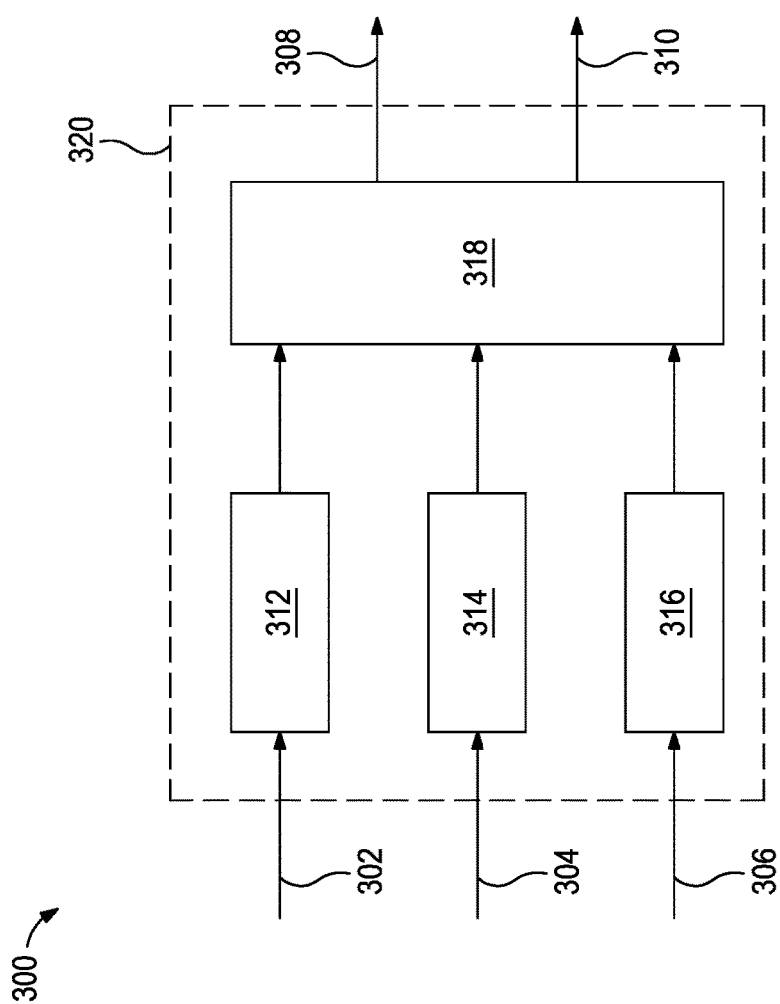
FIG. 3 illustrates a signal flow block diagram that represents the viscosity and density control system shown in FIG. 2.

FIG. 3 illustrates a signal flow block diagram 300 that represents a viscosity and density control system 200 of FIG. 2. The system 200 is generalized as a MIMO 320 that comprises a mechanical separation system 312 (e.g., shaker 202 of FIG. 2), a dilution system 314 (e.g., tank 210 of FIG. 2 and associated components), a chemical additive regulation system 316 (e.g., pit 216 of FIG. 2 and associated components like mixers) that produces a drilling mud 318. The MIMO 320 also has three control inputs: $u_m$ 302 (a control input for mechanical separation system 312 such as shaker), $u_d$ 304 (a control input for dilution system 314), and $u_c$ 306 (a control input for chemical additive regulation system 316). The control inputs 302,304,306 are received by their respective systems 312,314,316. Then, the systems 312,314,316 perform their respective operations to produce a drilling mud 318 having a $y_v$ 308 (controlled viscosity value) and a $y_\rho$ 310 (controlled density value).

Figure 4A:
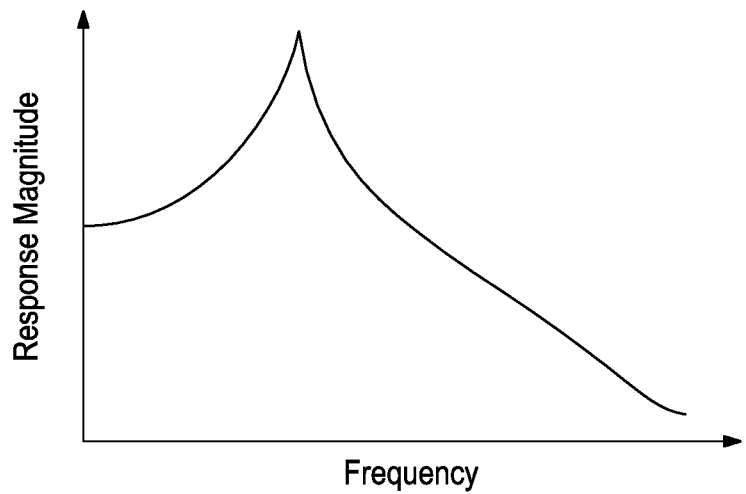
FIGS. 4A and 4B are exemplary plots of a non-linear frequency response of an output to an input.
Figure 4B:
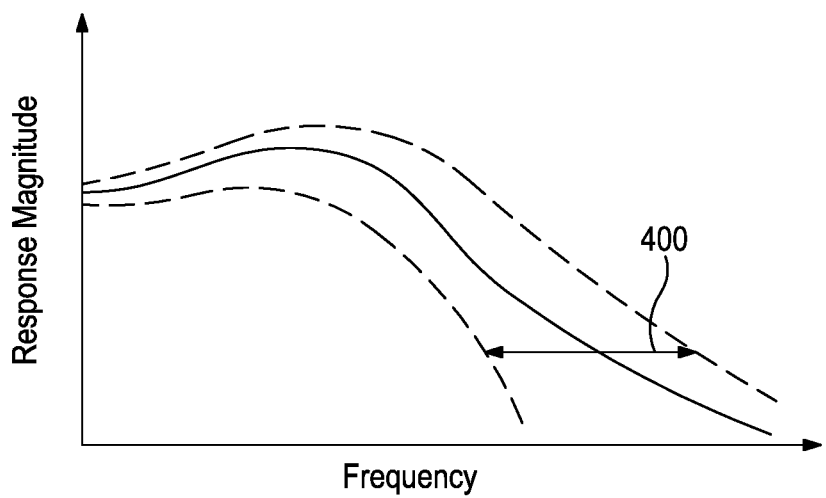

In some instances, the MIMO system 300 may be non-linear or time-varying where the outputs $y_v$ 308 and $y_\rho$ 310 have different frequency responses (G) for each of the inputs $u_m$ 302, $u_d$ 304, and $u_c$ 306. For example, FIG. 4A is an exemplary plot of frequency response ($G_{v \to m}$) of viscosity $y_v$ to the mechanical separation input $u_m$, where there is a spike or resonance at a specific frequency, which may correspond to the vibration frequency of a mechanical separation system like a shaker. In another example, FIG. 4B is an exemplary plot of frequency response ($G_{v \to d}$) of viscosity $y_v$ to the dilution input $u_d$, where the uncertainty 400 (area between the dotted lines) may increase with increasing frequency. Given the response difference for individual systems, the challenge is how to get a desired frequency response for the entire closed loop augmented system.

Figure 5:
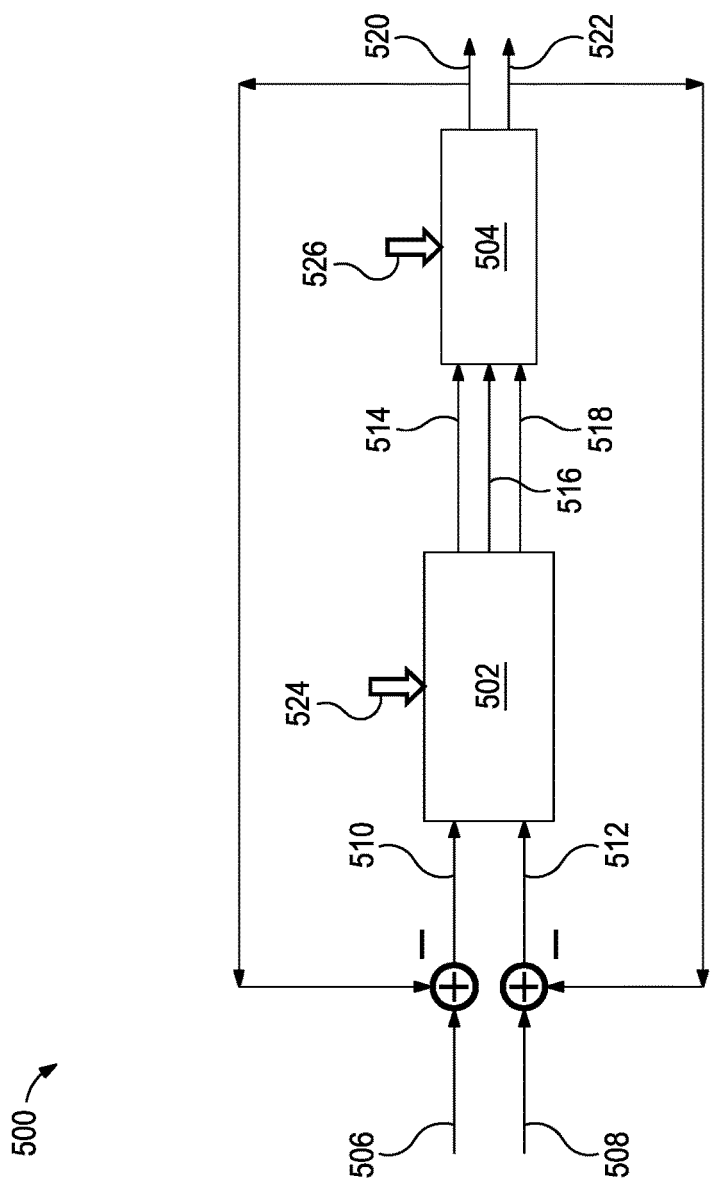
FIG. 5 illustrates an exemplary closed loop control system block diagram.

FIG. 5 illustrates the closed-loop control system block diagram 500 that comprises of a frequency loop shaping filter ($C_f(j\omega)$) 502 and a MIMO system 504. A desired viscosity 506 ($r_v^{des}$) and desired density 508 ($r_\rho^{des}$) with associated errors 510,512 ($e_v$, $e_\rho$), respectively, are inputs to the frequency loop shaping filter 502. The frequency loop shaping filter 502 is applied to each of the desired viscosity 506 ($r_v^{des}$) and desired density 508 ($r_\rho^{des}$ for each of the MIMO system 504 inputs $u_m$ 514, $u_d$ 516, and $u_c$ 518, which can be represented by the matrix in Equation (1).

$$\begin{bmatrix} C_1(j\omega) & C_2(j\omega) & C_3(j\omega) \\ C_4(j\omega) & C_5(j\omega) & C_6(j\omega) \end{bmatrix} \quad \text{Equation (1)}$$

In some instances, the loop shaping filter 502 may be designed and updated on-line to achieve the desired MIMO system frequency response.

The MIMO system 504 outputs $y_v$ 520 and $y_\rho$ 522. The errors 510,512 ($e_v$, $e_\rho$) are control error calculated by subtracting the desired viscosity 506 ($r_v^{des}$) and desired density 508 ($r_\rho^{des}$) from the outputs $y_v$ 520 and $y_\rho$ 522, respectively.

Uncertainty may optionally be accounted for in some instances. For example, the loop shaping filter may optionally include another input 524 that accounts for leaking and flow resistance in the mud circulation system. Leaking may occur as the drilling mud flows through the mud circulation system. Flow resistance is the viscous drag force between the drilling mud and the inner wall of the pipe or other structure/component containing the drilling mud.

In another example, the MIMO 204 may optionally include another input 526 that accounts for the disturbance and uncertainty for any un-modeled forces or physical effects that cannot be accurately modeled mathematically in advance. For example, events that induce vibration and environmental changes (e.g., pressure, temperature (at the surface or downhole), and humidity) may be measured and then accounted for with input 526.

Figure 6:
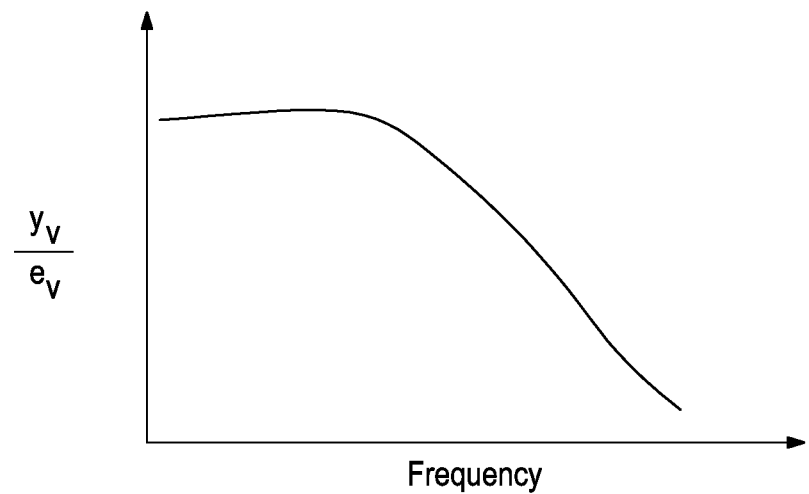
FIG. 6 illustrates an exemplary viscosity output response to the error.
Figure 7:
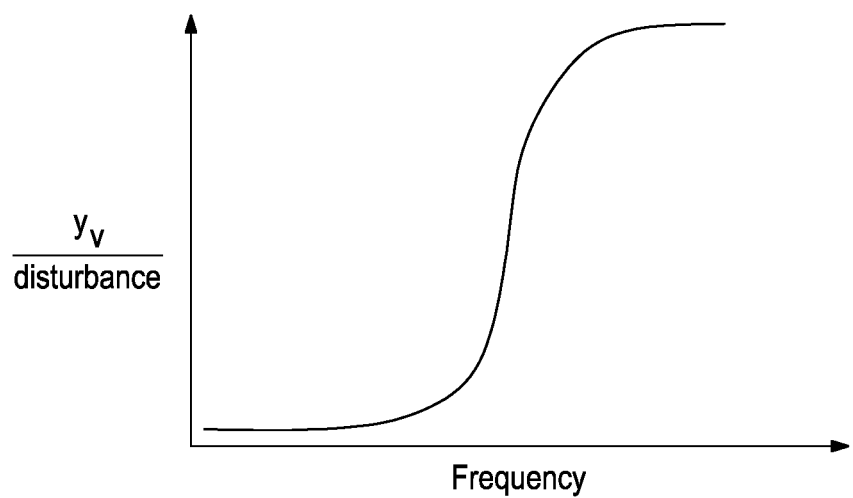
FIG. 7 illustrates an exemplary viscosity output response to the disturbance/uncertainty.

FIGS. 6 and 7 illustrate exemplary desired MIMO closed-loop control system frequency response. More specifically, FIG. 6 illustrates an exemplary viscosity output response to the error ($y_v/e_v$) as a function of frequency. Generally, the magnitude of the viscosity response should be large at low frequency if the tracking accuracy requirement is high and also high at mid-frequency if the viscosity and density control response requirement is high. At higher frequencies a high bandwidth may be needed for fast response.

FIG. 7 illustrates an exemplary viscosity output response to the disturbance/uncertainty ($y_v$/disturbance) as a function of frequency, which could also be described as the dynamic stiffness to disturbances. The dynamic stiffness is a measurement of how robust the system is to disturbances for the specified frequency. The controller can be tuned for stiffness to specific frequency content. At the low frequency end is a measurement of the ability to handle steady state, or slowly changing disturbances, such as slowly changing mud chemistry due to interaction with the formation. At the middle frequency range is a measurement of the ability to handle disturbances that happen at a faster rate, such as non-linearity in the valve leading to changing input rates in the mixing process. At the high frequency end may be vibrational issues with the shaker system. The magnitude of the dynamics stiffness at expected disturbance/uncertainty region should be small if the system expects large disturbance level at the given operation condition.

Figure 8:
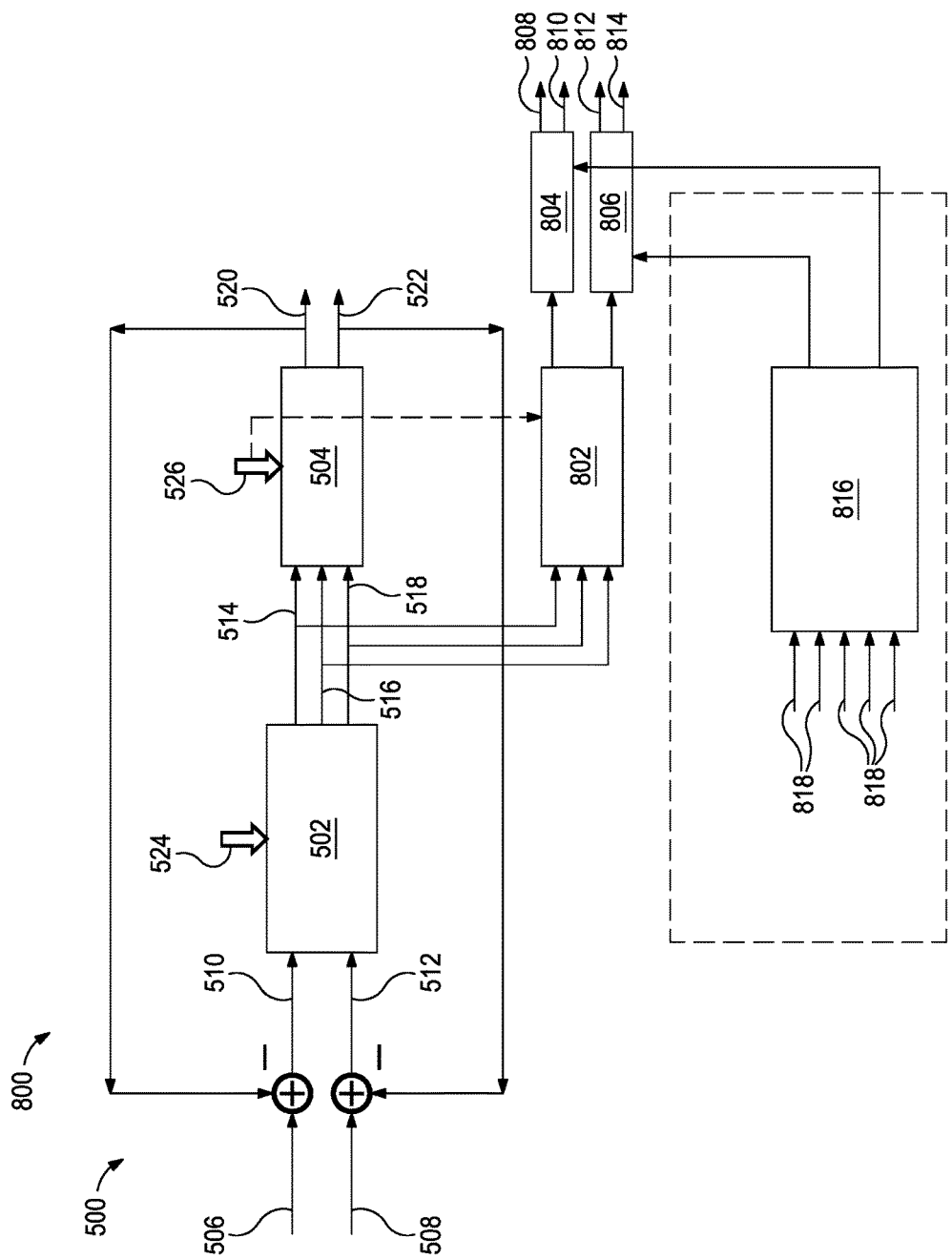
FIG. 8 illustrates an exemplary frequency loop shaping control architecture with real-time weighting function update and loop shaping filter adaptations.

So to achieve the desired MIMO system response, the loop shaping filter $C_1(j\omega)$ . . . $C_6(j\omega)$ may be updated in real-time. More specifically, FIG. 8 illustrates an exemplary frequency loop shaping control architecture 800 with real-time weighting function update and loop shaping filter adaptations. Expanding on the control system block diagram 500 of FIG. 5, a virtual physical model 802 may be embedded in the control software, where the outputs $u_m$ 514, $u_d$ 516, and $u_c$ 518 of the loop shaping filters 502 are its inputs. Weighting functions $W_1$ 804 and $W_2$ 806 are essentially two filters with designed magnitude at different frequency regions, and their outputs are the normalized density and viscosity response to $e_v/e_\rho$ ($y_{\rho\_e}^{norm}$ 808 and $y_{v\_e}^{norm}$ 810, respectively) and the normalized density and viscosity response to disturbance ($y_{\rho\_dist}^{norm}$ 812 and $y_{v\_dist}^{norm}$ 814, respectively).

Optionally, the weighting functions 804,806 may be updated in real-time based on defined rules 816 that are based on various system parameters 818 (e.g., desired flow rate, desired control accuracy, disturbance/uncertainty, response requirement, and other constraints).

Figure 9:
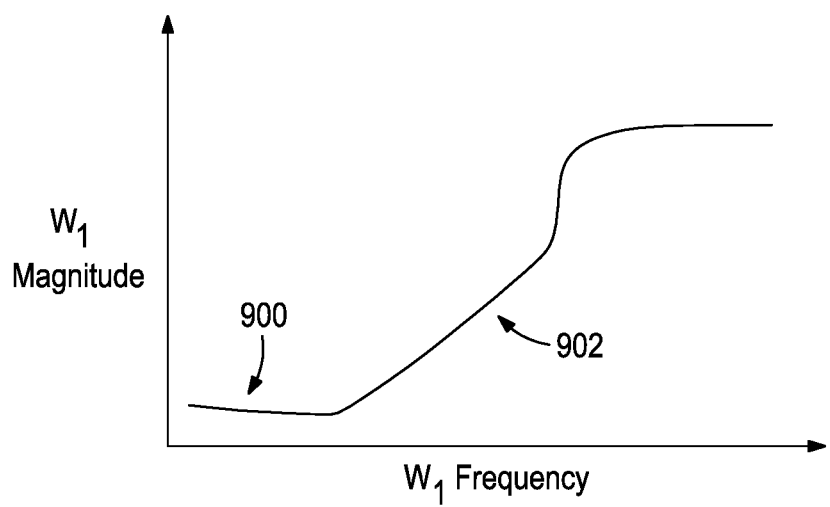
FIG. 9 illustrates weighting function design/update for weighting function $W_1$.
Figure 10:
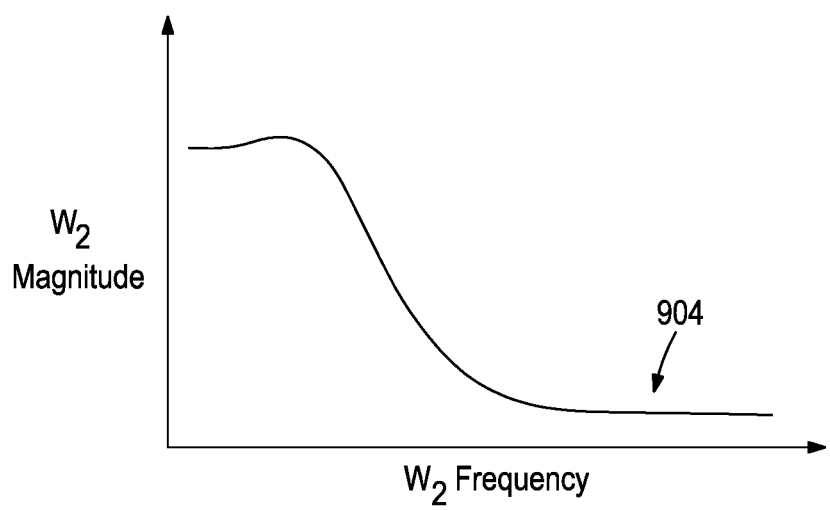
FIG. 10 illustrates weighting function design/update for weighting function $W_2$.

For example, three parameters that may be used to define the weighting functions 804,806 are shown in FIGS. 9 and 10, which is the magnitude of $W_1$ or $W_2$, respectively, as a function of frequency. Magnitude 900 and Magnitude 902 are the filter magnitude at low and high frequency respectively for $W_1$, and Magnitude 904 is the filter magnitude at high frequency for $W_2$. If flow rate is high or the system response is high, then Magnitude 902 should be decreased. If viscosity and density tracking accuracy level is raised, then Magnitude 900 should be further decreased. If the expected system uncertainty/disturbance is high, then Magnitude 904 should be further reduced. Then, the optimization problem to shape the frequency loop could be given as Equation (2).

TABLE 1

|  | Higher Flow Rate/Response | Tracking Accuracy Requirement Increase | Uncertainty/ Disturbance Level Increase |
|---|---|---|---|
| Magnitude 900 |  | decrease |  |
| Magnitude 902 | decrease |  |  |
| Magnitude 904 |  |  | decrease |

$$\min\left( h_1 \frac{|y_{\rho\_e}^{norm}|_2}{|e_\rho|_2} + h_2 \frac{|y_{v\_e}^{norm}|_2}{|e_v|_2} + h_3 \frac{|y_{\rho\_dis}^{norm}|_2}{|\text{distrubance}|_2} + h_4 \frac{|y_{v\_dis}^{norm}|_2}{|\text{distrubance}|_2} \right) \quad \text{Equation (2)}$$

subject to constraints on operation cost, operation range, fluid weight, and the like.
where:

$$h_1 \frac{|y_{\rho\_e}^{norm}|_2}{|e_\rho|_2}$$

represents the division of $l^2$-norm of the corresponding signals.

The optimization problem above may be convex, which could be solved efficiently by a proper solver in real-time on-line. The loop frequency shaping filters $C_1(j\omega)$ . . . $C_6(j\omega)$ can therefore be computed under this optimization problem, and updated on-line in real time to enable desired overall system frequency response. The methods and systems described herein may be applied to control and automate changing/optimizing/maintaining drilling mud viscosity and density.

The control system(s) described herein and corresponding computer hardware used to implement the various illustrative blocks, modules, elements, components, methods, and algorithms described herein may include a processor configured to execute one or more sequences of instructions, programming stances, or code stored on a non-transitory, computer-readable medium. The processor may be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any suitable entity that can perform calculations or other manipulations of data. In some embodiments, computer hardware may further include elements such as, for example, a memory (e.g., random access memory (RAM), flash memory, read only memory (ROM), programmable read only memory (PROM), erasable programmable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Embodiments described herein may include, but are not limited to, Embodiment A, Embodiment B, and Embodiment C.

Embodiment A is a method comprising: drilling a wellbore while circulating a drilling mud through a viscosity and density control system that comprises one selected from the group consisting of a mechanical separation system, a dilution system, a chemical additive regulation system, and any combination thereof; applying a frequency loop shaping filter to a desired mud viscosity and a desired mud density, thereby producing control signals selected from the group consisting of: a first control signal for the mechanical separation system, a second control signal for the dilution system, a third control signal for the chemical additive regulation system, and any combination thereof; and applying the control signals to the mechanical separation system, the dilution system, and the chemical additive regulation system, thereby altering the drilling mud to have a controlled viscosity value and a controlled density value Embodiment B is a mud circulation system comprising: a viscosity and density control system having drilling mud circulating therethrough, the viscosity and density control system comprising one selected from the group consisting of a mechanical separation system, a dilution system, a chemical additive regulation system, and any combination thereof; a non-transitory computer-readable medium communicably coupled to the viscosity and density control system and encoded with instructions that, when executed, cause the mud circulation system to perform a method comprising: applying a frequency loop shaping filter to a desired mud viscosity and a desired mud density, thereby producing control signals selected from the group consisting of: a first control signal for the mechanical separation system, a second control signal for the dilution system, a third control signal for the chemical additive regulation system, and any combination thereof; and applying the control signals to the mechanical separation system, the dilution system, and the chemical additive regulation system, thereby altering the drilling mud to have a controlled viscosity value and a controlled density value Embodiment C is a non-transitory computer-readable medium communicably coupled to a viscosity and density control system and encoded with instructions that, when executed, cause a mud circulation system to perform a method comprising: applying a frequency loop shaping filter to a desired mud viscosity and a desired mud density, thereby producing control signals selected from the group consisting of: a first control signal for a mechanical separation system of the viscosity and density control system, a second control signal for a dilution system of the viscosity and density control system, a third control signal for a chemical additive regulation system of the viscosity and density control system, and any combination thereof; applying a frequency loop shaping filter to a desired mud viscosity and a desired mud density, thereby producing control signals selected from the group consisting of: a first control signal for the mechanical separation system, a second control signal for the dilution system, a third control signal for the chemical additive regulation system, and any combination thereof; and applying the control signals to the mechanical separation system, the dilution system, and the chemical additive regulation system, thereby altering the drilling mud to have a controlled viscosity value and a controlled density value.

Embodiments A, B, and C may optionally include at least one of the following: Element 1: wherein the controlled viscosity value is within 10% of the desired mud viscosity; Element 2: wherein the controlled density value is within 10% of the desired mud density; Element 3: wherein the frequency loop shaping filter accounts for leaking and flow resistance in the viscosity and density control system; Element 4: the method further comprising: generating a density weighting function and a viscosity weighting function based on parameters of the mud circulation system, uncertainty, and disturbance; Element 5: Element 4 and the method further comprising: inputting the control signals into the virtual physical model and applying the density and viscosity weighting functions to produce a normalized density and a normalized viscosity; and Element 6: the method further comprising: calculating a viscosity control error by subtracting the desired mud viscosity from the controlled viscosity value; and calculating a density control error by subtracting the desired mud density from the controlled density value. Exemplary combinations may include, but are not limited to, Elements 1 and 2 in combination; Element 3 in combination with one or both of Elements 1 and 2; Elements 4 and 6 in combination and optionally in further combination with Element 5; Elements 4 and 6 in combination with one or both of Elements 1 and 2 and optionally in further combination with Element 5; and Element 3 in combination with one or both of Elements 4 and 6 and optionally in further combination with one or more of Elements 1, 2, and 5.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The following is claimed:

1. A method comprising:
    drilling a wellbore while circulating a drilling mud through a viscosity and density control system that comprises one selected from the group consisting of a mechanical separation system, a dilution system, a chemical additive regulation system, and any combination thereof;
    applying a frequency loop shaping filter to a desired mud viscosity and a desired mud density, thereby producing control signals selected from the group consisting of: a first control signal for the mechanical separation system, a second control signal for the dilution system, a third control signal for the chemical additive regulation system, and any combination thereof; and
    applying the control signals to the mechanical separation system, the dilution system, and the chemical additive regulation system, thereby altering the drilling mud to have a controlled viscosity value and a controlled density value.

2. The method of claim 1, wherein the controlled viscosity value is within 10% of the desired mud viscosity.

3. The method of claim 1, wherein the controlled density value is within 10% of the desired mud density.

4. The method of claim 1, wherein the frequency loop shaping filter accounts for leaking and flow resistance in the viscosity and density control system.

5. The method of claim 1, wherein comprising: generating a density weighting function and a viscosity weighting function based on parameters of a mud circulation system, uncertainty, and disturbance.

6. The method of claim 5 further comprising: inputting the control signals into a virtual physical model and applying the density and viscosity weighting functions to produce a normalized density and a normalized viscosity.

7. The method of claim 1 further comprising: calculating a viscosity control error by subtracting the desired mud viscosity from the controlled viscosity value; and calculating a density control error by subtracting the desired mud density from the controlled density value.

8. A mud circulation system comprising:
    a viscosity and density control system having drilling mud circulating therethrough, the viscosity and density control system comprising one selected from the group consisting of a mechanical separation system, a dilution system, a chemical additive regulation system, and any combination thereof;
    a non-transitory computer-readable medium communicably coupled to the viscosity and density control system and encoded with instructions that, when executed, cause the mud circulation system to perform a method comprising:
    applying a frequency loop shaping filter to a desired mud viscosity and a desired mud density, thereby producing control signals selected from the group consisting of: a first control signal for the mechanical separation system, a second control signal for the dilution system, a third control signal for the chemical additive regulation system, and any combination thereof; and applying the control signals to the mechanical separation system, the dilution system, and the chemical additive regulation system, thereby altering the drilling mud to have a controlled viscosity value and a controlled density value.

9. The mud circulation system of claim 8, wherein the controlled viscosity value is within 10% of the desired mud viscosity.

10. The mud circulation system of claim 8, wherein the controlled density value is within 10% of the desired mud density.

11. The mud circulation system of claim 8, wherein the frequency loop shaping filter accounts for leaking and flow resistance in the viscosity and density control system.

12. The mud circulation system of claim 8, wherein the method further comprises: generating a density weighting function and a viscosity weighting function based on parameters of the mud circulation system, uncertainty, and disturbance.

13. The mud circulation system of claim 12, wherein the method further comprises: inputting the control signals into a virtual physical model and applying the density and viscosity weighting functions to produce a normalized density and a normalized viscosity.

14. The mud circulation system of claim 8, wherein the method further comprises: calculating a viscosity control error by subtracting the desired mud viscosity from the controlled viscosity value; and calculating a density control error by subtracting the desired mud density from the controlled density value.

15. A non-transitory computer-readable medium communicably coupled to a viscosity and density control system and encoded with instructions that, when executed, cause a mud circulation system to perform a method comprising:

applying a frequency loop shaping filter to a desired mud viscosity and a desired mud density, thereby producing control signals selected from the group consisting of: a first control signal for a mechanical separation system of the viscosity and density control system, a second control signal for a dilution system of the viscosity and density control system, a third control signal for a chemical additive regulation system of the viscosity and density control system, and any combination thereof; and applying the control signals to the mechanical separation system, the dilution system, and the chemical additive regulation system, thereby altering drilling mud to have a controlled viscosity value and a controlled density value.

16. The non-transitory computer-readable medium of claim 15, wherein the controlled viscosity value is within 10% of the desired mud viscosity.

17. The non-transitory computer-readable medium of claim 15, wherein the controlled density value is within 10% of the desired mud density.

18. The non-transitory computer-readable medium of claim 15, wherein the frequency loop shaping filter accounts for leaking and flow resistance in the viscosity and density control system.

19. The non-transitory computer-readable medium of claim 15, wherein the method further comprises: generating a density weighting function and a viscosity weighting function based on parameters of the mud circulation system, uncertainty, and disturbance.

20. The non-transitory computer-readable medium of claim 15, wherein the method further comprises: calculating a viscosity control error by subtracting the desired mud viscosity from the controlled viscosity value; and calculating a density control error by subtracting the desired mud density from the controlled density value.

* * * * *